(12) United States Patent
Horie

(10) Patent No.: US 6,329,855 B1
(45) Date of Patent: Dec. 11, 2001

(54) FREQUENCY SYNTHESIZER

(75) Inventor: Hiroshi Horie, Hino (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/592,979

(22) Filed: Jun. 13, 2000

(30) Foreign Application Priority Data

Jun. 14, 1999 (JP) ................................................ 11-167303

(51) Int. Cl.$^7$ .............................. H03K 23/00; H03L 7/08
(52) U.S. Cl. .......................... 327/159; 327/160; 331/1 A; 331/17; 377/47; 377/52
(58) Field of Search .................................... 327/159, 160, 327/231, 151; 331/1 A, 16; 377/52, 47

(56) References Cited

U.S. PATENT DOCUMENTS 5,045,813 * 9/1991 Yamashita et al. ..................... 331/16
6,031,425 * 2/2001 Hasegawa ............................. 327/159
6,094,100 * 7/2000 Kamikubo et al. .................. 327/159

FOREIGN PATENT DOCUMENTS 2732625    12/1997   (JP) .

* cited by examiner

Primary Examiner—Dinh T. Le
(74) Attorney, Agent, or Firm—Finnegan, Henderson, Farabow, Garrett & Dunner, L.L.P.

(57) ABSTRACT

A frequency synthesizer has a voltage controlled oscillator to generate a oscillation signal of a frequency corresponding to a control voltage, a divider to divide the oscillation signal and to generate a dividing signal, a reference signal oscillator to generate a reference signal, a phase comparator to obtain a phase error between the reference signal and the dividing signal, and a filter to smooth the comparison result of the phase comparator and generate the control voltage, in which the divider comprises a swallow counter which times a switching time of a number of dividings, a prescaler to divide the oscillation signal by the number of dividings corresponding to the switching time timed with the swallow counter, a variable divider to divide a dividing result of the prescaler by a number of dividings set by a user, and a dividing number change controller to change a relation between the number of dividings and a switching time of the numbers of dividings in the prescaler.

22 Claims, 4 Drawing Sheets

FREQUENCY SYNTHESIZER

CROSS-REFERENCE TO RELATED APPLICATIONS

This application is based upon and claims the benefit of priority from the prior Japanese Patent Application No. 11-167303, filed Jun. 14, 1999, the entire contents of which are incorporated herein by reference.

BACKGROUND OF THE INVENTION

The present invention relates to a frequency synthesizer of a pulse swallow method.

A PLL (Phase-Locked Loop) synthesizer of a pulse swallow method is known.

In the usual synthesizer, since all the circuits except the reference signal oscillator and the voltage controlled oscillator can be constructed with a digital circuit, the circuit has been miniaturized by integrating these circuits. In this specification, this is called "Synthesizer IC", and, hereinafter, it is expressed as "PLLIC".

When integrating the above-mentioned circuits, it is preferable to construct the circuit by C-MOS in view of the low consumption current. But, since it is difficult to directly divide a local frequency of the radio set, it is general that the first stage of frequency dividing section is assumed to be a circuit configuration such as ECL (Emitter-Coupled Logic) etc. which can operate at high speed though the consumption current somewhat increases.

In that case, when assuming the number of dividings of frequencydividers (called as a prescaler), which is constructed with ECL to be K and when inserting variable frequencydividers with the number of dividings N to it in series, and incrementing and decrementing N by one, the number of dividings in the whole can be changed only with intervals of K.

In the radio set, the communication frequency is provided with a constant interval (channel interval), and it is necessary to switch a reference signal according to it. Therefore, since the frequencies of signals of dividing compared with the above-mentioned reference signal with phase comparator 2 must coincide with 1/K of channel interval, the response of the entire circuit slows, and it is unsuitable to the high-speed channel switch required to the radio set of a digital method.

Therefore, variable frequencydividers of the number of dividings A are provided in the frequency section in parallel with a variable frequencydivider which divides N, and two numbers of dividings (K, K+1) are switched by prescaler 5.

Such a circuit configuration is known as a pulse swallow method, and detailed operation will be described later. The number of dividings can be changed by one by such a circuit configuration.

By the way, when the miniaturization is required like the cellular phone, synthesizer ICs are integrated in addition to other circuits.

However, when integrating various circuits by integration, since PLLIC is a digital circuit, the dividing component and the harmonic component thereof are easily generated as a noise, especially, the influence on the circuit (for example, mixer and limiter, etc.), which treats the low level signal, becomes a disadvantage.

For example, a case that PLLIC is applied to the cellular phone, will be considered.

The frequency of the first intermediate frequency signal often used in the cellular phone is 130 MHz band. At this time, since it is necessary to adjust the reception frequency to ±130 MHz, the frequency of the first local signal is in the vicinity of 1 GHz.

Here, in the prescaler of PLLIC, in view of the easiness of the configuration, the values of the number of dividings K are often assumed to be n power of two. The output frequency of the prescaler becomes almost 31 MHz when assuming K=32, here.

Then, the fourth harmonic of the output frequency of the prescaler becomes 124 MHz, and is near the frequency of the first intermediate frequency signal. Since the communication channel is allocated in tens of MHz band, an actual cellular phone, the frequency of the first intermediate frequency signal is corresponding to the harmonic component of the prescaler output at a considerably high probability, and the number of channels before and after that will be influenced by the high frequency component.

In addition, since the frequency, to which the harmonic component corresponds, is quad-wave of output of the prescaler with 32 harmonics, and corresponds to eight dividings in the entire frequencydivider of PLLIC, the channel influenced by the harmonic component includes the point with the largest influence, and includes the number of channels before and behind that.

As mentioned above, it is preferable to integrate a part of the radio section by integration, and to miniaturize the circuit, but PLLIC, which is a digital circuit, has the problem that the obstruction might be given to other circuits, especially, the receiver circuit.

It is certain to separate PLLIC with the receiver circuit to solve this problem, but the request of the radio set to the miniaturization cannot be satisfied.

In another method, the number of dividings of prescaler is set to a frequency, which does not become a disadvantage, but this method also has the fault.

Even when limiting to the cellular phone, by considering use with other systems, since there is two kinds of use in which either of upper or lower frequency of the reception frequency is taken in the first local signals, it is difficult to achieve the configuration to which those frequencies are not surely corresponding. To solve the above-mentioned problem surely, since synthesizer IC, which sets PLLIC, must be manufactured, according to each system, furthermore, each upper and lower frequency of a local signal, and to each user according to circumstance, there is a disadvantage in a general purpose.

As described above, in the conventional frequency synthesizer, when integrating the synthesizer with the circuit of the receiver circuit of the radio set by integration, there is a disadvantage that there is fear to obstruct the circuit of the receiver circuit by the noise generated from the synthesizer part.

BRIEF SUMMARY OF THE INVENTION

An object of the present invention is to provide a frequency synthesizer, which does not obstruct circuit of receiver circuit without losing the versatility, even when integrating the synthesizer with circuit of receiver circuit by integration.

To achieve the above-mentioned object, a frequency synthesizer according to the present invention is characterized by comprising a voltage controlled oscillator to generate a oscillation signal of a frequency corresponding to a control voltage; a divider to divide the oscillation signal and to generate a dividing signal; a reference signal oscillator to generate a reference signal; a phase comparator to obtain a phase error between the reference signal and the dividing signal; and a filter to smooth the comparison result of the phase comparator and generate the control voltage, in which the divider comprises a swallow counter which times a switching time of a number of dividings, a prescaler to divide the oscillation signal by the number of dividings corresponding to the switching time timed with the swallow counter, a variable divider to divide a dividing result of the prescaler by a number of dividings set by a user, and a dividing number change controller to change a relation between the number of dividings and a switching time of the numbers of dividings in the prescaler.

The preferred manners of the above-mentioned frequency synthesizer are as follows.

(1) The swallow counter indicates a passage of the switching time of the number of dividings at a level of a signal, the prescaler divides the oscillation signal by the number of dividings corresponding to the signal level indicated by the swallow counter, and the dividing number change controller changes a polarity of a signal to the prescaler.

(2) A change in the relation in the dividing number change controller is performed based on a control signal obtained by a predetermined arithmetic.

(3) The prescaler selectively sets one of $2^n$ and $2^{n+1}$ to the number of dividings according to the switching time timed with the swallow counter, and the swallow counter times the switching time of the number of dividings of the prescaler by using a register with a larger number of stages than that of n stages (n is a natural number).

The cellular phone according to the present invention is characterized by comprising: a transmitter/receiver circuit which transmits/receives a signal; and the above-mentioned frequency synthesizer.

According to the frequency synthesizer of the above-mentioned configuration, since the relation between the number of dividings and the switching time of the numbers of dividings in the prescaler can be changed, the frequency of the harmonic which is generated caused by the output of the prescaler can be changed. Therefore, even when integrating the corresponding frequency synthesizer with the circuit of the reception system of the applied radio set by integration, the circuit of the reception system can be prevented being obstructed without loosing generality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
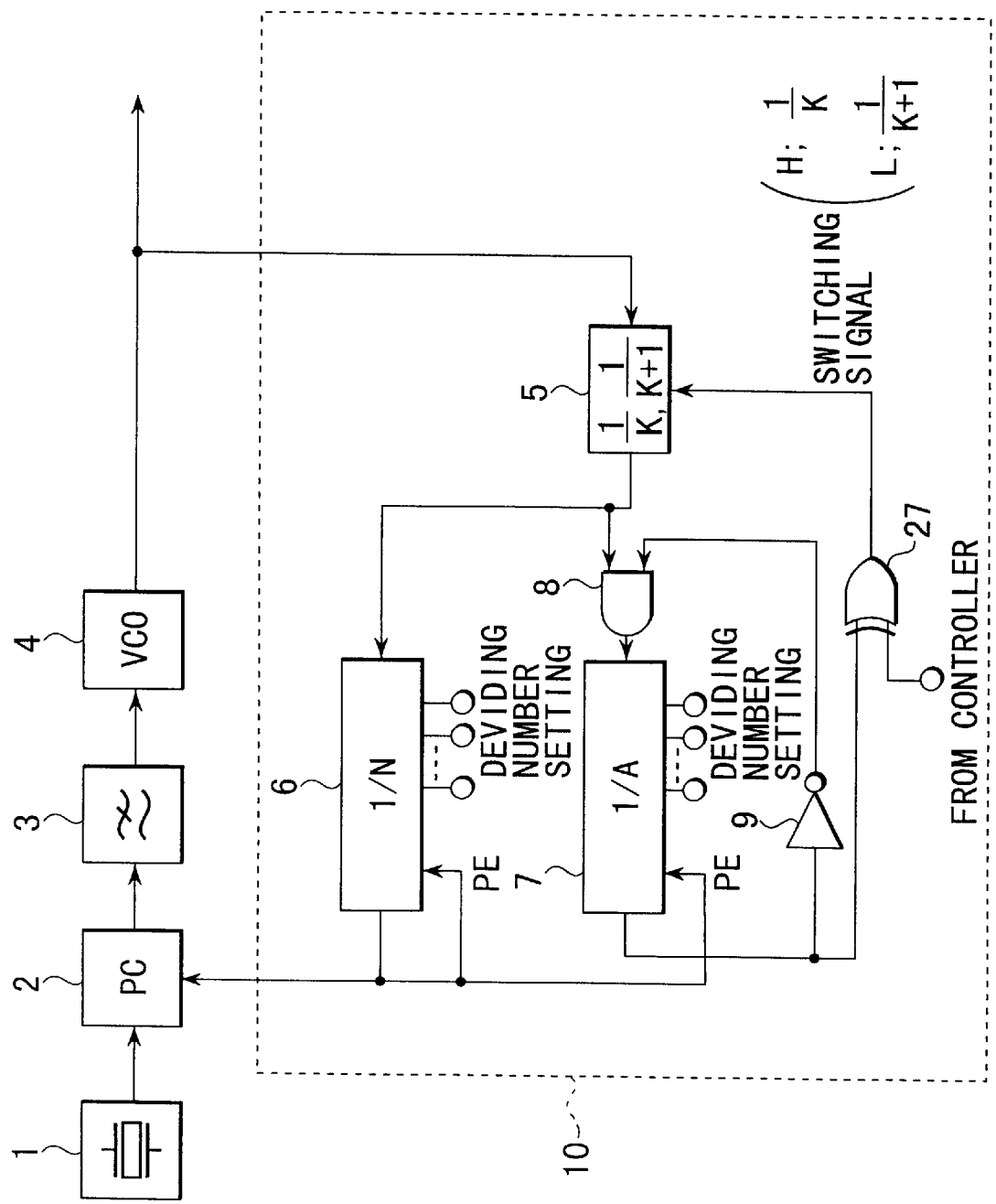
FIG. 1 is a circuit block diagram, which shows a configuration of an embodiment of the frequency synthesizer according to the present invention.

Hereinafter, an embodiment of the present invention will be explained referring to the drawings.

FIG. 1 is a figure, which shows a configuration of the frequency synthesizer according to an embodiment of the present invention.

The frequency synthesizer comprises reference signal oscillator 1, phase comparator (PC) 2, low-pass filter 3, voltage controlled oscillator (VCO) 4, and frequency dividing section 10. In FIG. 1, to miniaturize the device, all the parts (A section in the figure) except reference signal generator 1 and voltage control oscillator 4 are integrated.

A reference signal with the predetermined frequency generated by reference signal oscillator 1 is input to phase comparator 2. Phase comparator 2 detects the phase error between the above-mentioned reference signal and the signal, in which the local signal generated with voltage controlled oscillator 4 is divided with frequency dividing section 10.

The phase error detected with phase comparator 2 is smoothed to the DC component through low-pass filter 3, thereafter the smoothed signal is fedback to voltage controlled oscillator 4. Voltage controlled oscillator 4 generates a local signal of the frequency corresponding to the voltage of the above-mentioned smoothed signal.

With such a loop control, the frequency of the local signal generated with voltage controlled oscillator 4 is locked to the value in which the frequency of the above-mentioned reference signal is multiplied by the number of dividings of frequency dividing section 10.

Frequency dividing section 10 comprises prescaler 5, variable frequencydivider 6, variable frequencydivider (swallow counter) 7, AND gate 8, inverter 9, and polarity changer 27.

Prescaler 5 divides the local signal generated with voltage controlled oscillator 4 by the number of dividings corresponding to the output (hereafter, called as a switch signal) of polarity changers 27 described later in detail. Prescaler 5 outputs the "L" level signal while dividing, and when dividing is completed, outputs the "H" level signal.

Prescaler 5 performs K dividings when the above-mentioned switch signal is "H" level signal, and, on the other hand, performs K+1 dividings for the "L" level signal. This dividing result is output to variable frequencydivider 6 and one input terminal of AND gate 8.

Variable frequencydivider 6 performs N dividings of the dividing result of prescaler 5. Variable frequencydivider 6 outputs the "L" level signal while dividing, and outputs the "H" level signal when dividing is completed. This dividing result is output to phase comparator 2 and is output to preset terminal (PE), respectively, as preset signals to variable frequencydivider 6 and variable frequencydivider 7.

The dividing result of prescaler 5 is input to another input terminal of AND gate 8, and the output of variable frequencydivider 7 is inversely input to another input terminal thereof through inverter 9. And, AND gate 8 performs these logical products, and the result is input to variable frequencydivider 7.

Variable frequencydivider 7 performs A dividing of the output of AND gate 8. Variable frequencydivider 7 outputs the "L" level signal while dividing, and when dividing is completed, outputs the "H" level signal. This dividing result is inversely input to AND gate 8 through inverter 9, and is input to polarity changer 27.

The present invention is characterized by comprising polarity changer 27. Polarity changer 27 is an EX-OR gate, inputs the dividing result of variable frequencydivider 7 and the switch control signal, respectively, performs the exclusive-OR thereof, and this result is input to prescaler 5 as a switch signal. The above-mentioned change control signal is set in the "H" level signal or the "L" level signal, beforehand, before operating the corresponding synthesizer.

Therefore, polarity changer 27 operates as a mere buffer when the change control signal is "L" level signal, and outputs the dividing result of variable frequencydivider 7 to prescaler 5 as the above-mentioned switch signal. On the other hand, when the change control signal is "H" level signal, polarity changer 27 operates as an inverter, inverts the dividing result of variable frequencydivider 7, and outputs a result to prescaler 5 as the above-mentioned switch signal.

Operation of the frequency synthesizer, which is constructed as described above will be explained.

The outputs of variable frequencydivider 6 and variable frequencydivider 7 are "L" at the start of dividing, and prescaler 5 is operating in the number of dividings K+1. Under such a condition, the output signal becomes "H" when dividing proceeds and variable frequencydivider 7 completes dividing, and prescaler 5 changes into 1/K dividing.

At the same time, by applying the above-mentioned output signal "H" to AND gate 8 through inverter 9, the input of variable frequencydivider 7 is fixed to "L" and the operation of variable frequencydivider 7 stops.

And, when dividing proceeds with this state, variable frequencydivider 6 completes dividing, and the output signal becomes "H". This output signal is applied to phase comparator 2 as an output of the whole frequency dividing section 10, and, at the same time, is added to preset terminals (PE) of two variable frequencydivider 6 and variable frequencydividers 7, presets the number of dividings and returns both of frequencydivider outputs to "L". As a result, variable frequencydivider 7 starts operation, again.

By the above-mentioned operation, (K+1)×A dividing is performed in the whole frequency dividing section 10 while variable frequencydivider 7 is operating, and, the K×(N−A) dividing is further performed by the whole frequency dividing section 10 until variable frequencydivider 6 completes the operation.

Therefore, the average number of dividings of frequency dividing section 10 becomes (K+1)×A+K×(N−A)=N×K+A. Even though prescaler 5 is used, the number of dividings of whole frequency dividing section 10 can be changed by one by incrementing and decrementing N and A by one. It is needless to say that it is N>A.

As mentioned above, since the number of dividings of whole frequency dividing section 10 is N×K+A, N is a quotient and A is the remainder when the number of dividings is divided by K. That is, the maximum value of A becomes K−1.

Figure 2A:
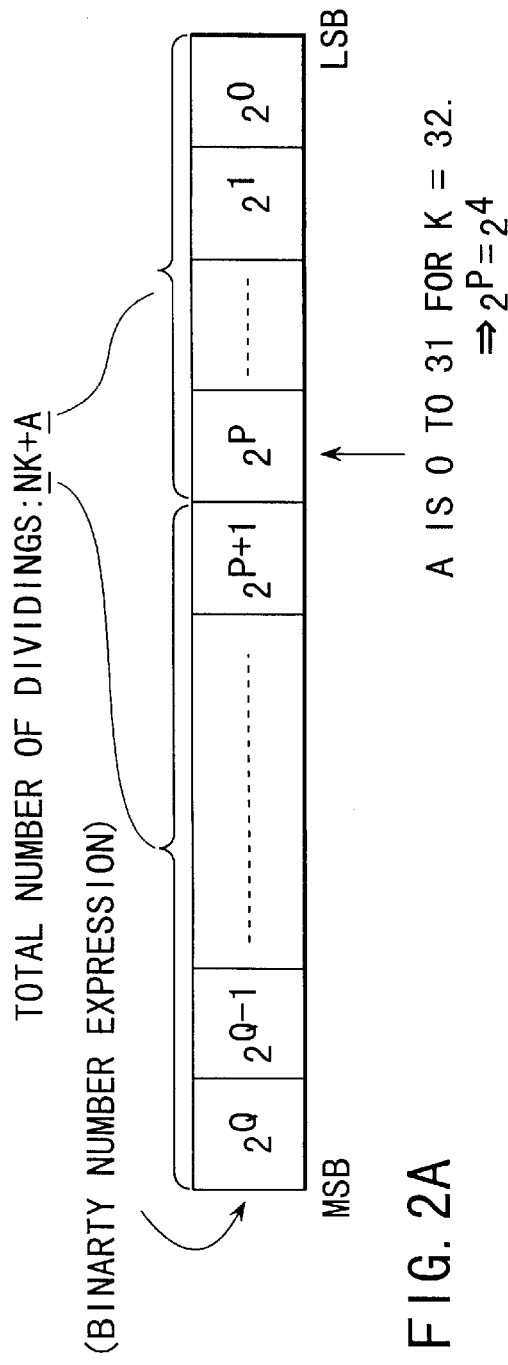
FIG. 2A and FIG. 2B are figures to compare the number of necessary bits when the number of dividings of the entire frequency dividing sections in the conventional art and the present invention are expressed in binary.

Therefore, when the value of K is expressed by "$2^n$" (n is a natural number), if the values of N and A are expressed by the binary number, respectively, as shown in FIG. 2A, the value in which N and A expressed by the binary number are continuously combined, completely coincides with the value in which the entire value is expressed by the binary number.

In the present invention, since polarity changer 27 is used, above-mentioned number of dividings and average number thereof is different according to the operation. This reason will be explained.

In a case that the polarity inversion of the switch signal is not performed when the change control signal is the "L" level signal, the number of dividings becomes N×K+A in the whole frequency dividing section 10.

On the other hand, in a case that when the polarity inversion of the switch signal is performed when the change control signal is the "H" level signal, the K×A dividing is performed in the whole frequency dividing section 10 while variable frequencydivider 7 is operating in the beginning. (K+1)×(N−A) dividing is further performed by the whole frequency dividing section 10 until variable frequencydivider 6 completes operation.

Therefore, the average number of dividings of frequency dividing section 10 becomes (N−A)=K×A+(K+1)×N·(K+1)−A, even though prescaler 5 is used, by incrementing and decrementing N and A by one, the number of dividings of whole frequency dividing section 10 can be changed by one.

Figure 2B:
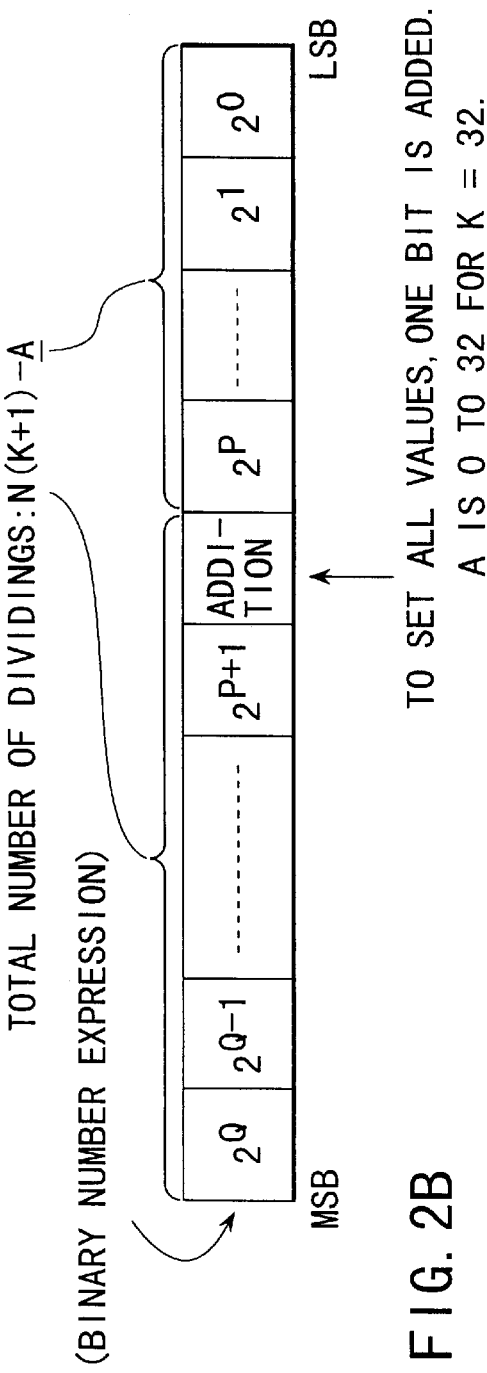

However, in this case, since the average number of dividings is N·(K+1)−A, it becomes necessary to set the maximum value of A to K in order to arbitrarily set the number of dividings of whole frequency dividing section 10. Therefore, the conventional control data has one bit short, since the maximum value of A is K. Therefore, when the value of N and A is shown by the binary number respectively if the value of K is assumed to be "$2^n$" (n is a natural number), for example, it is desirable to add one bit to set the value of A up to K (as maximum value of A) as shown in FIG. 2B in a conventional variable frequencydivider.

Next, operation of the frequency synthesizer of the above-mentioned configuration will be explained as follows. In the following examples, the application target is assumed to be a cellular phone.

Figure 3:
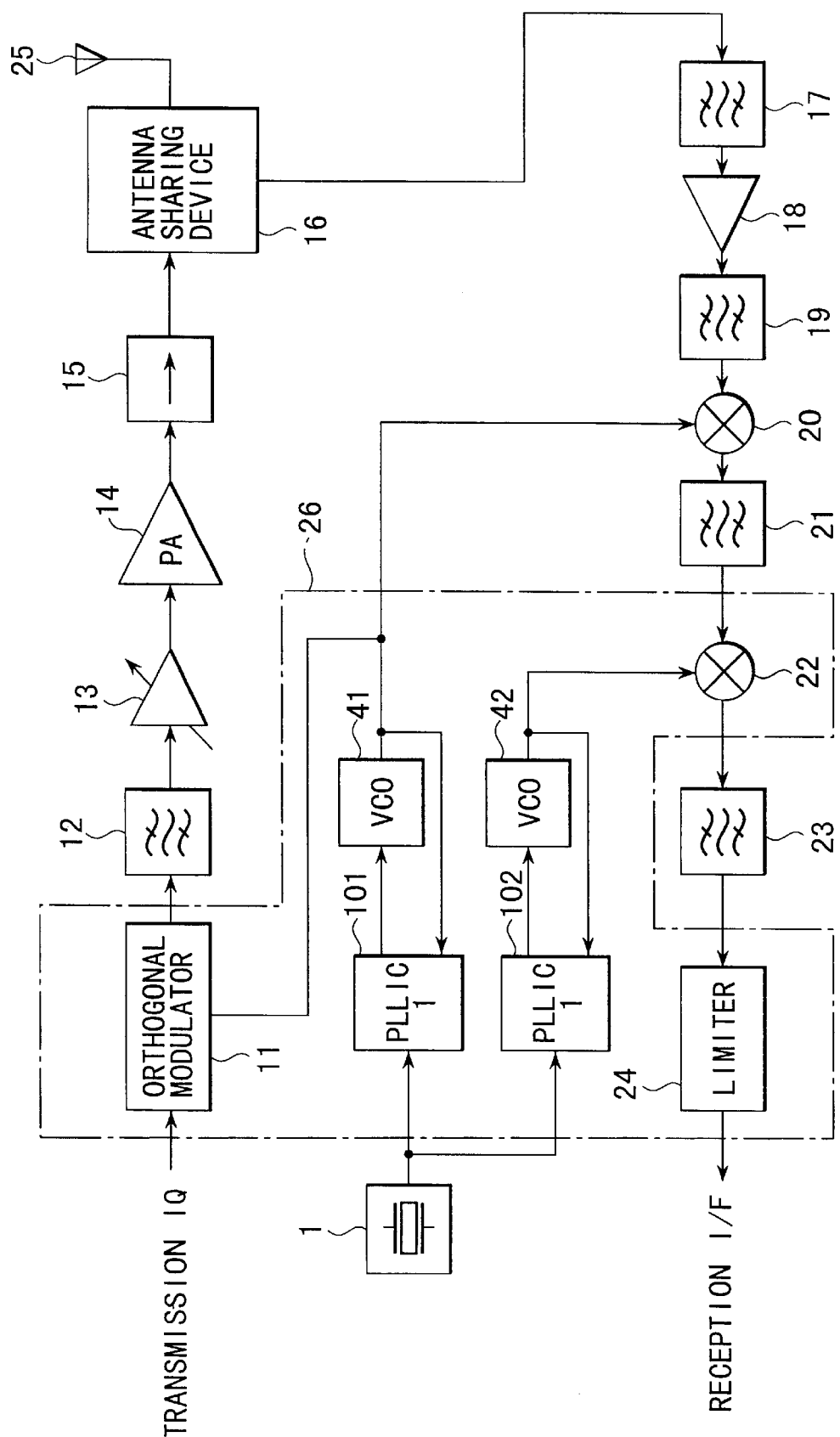
FIG. 3 is a circuit block diagram, which shows a configuration of the radio section to which the frequency synthesizer is applied.

First, the configuration of the radio section in the cellular phone to which the frequency synthesizer of the present invention is applied is shown in FIG. 3. In FIG. 3, two PLLICs shown by A in FIG. 1 are used, and are expressed as PLLIC 101 and PLLIC 102, respectively.

The first local signal, which is generated with voltage controlled oscillator (VCO) 41 based on the output signal of PLLIC 101, is branched to three signals, the first signal is input to PLLIC 101 and divided, the second signal is input to quadrature modulator 11, and the third signal is input to first mixer 20.

Quadrature modulator 11 modulates the first local signal by transmission IQ signal. An unnecessary wave of the first modulated local signal is removed by band-pass filter (BPF) 12, is adjusted with variable gain amplifier 13 to an appropriate level, and, is amplified by power amplifier (PA) 14 to a power necessary for the communication. In addition, the load of above-mentioned power amplifier 14 is stabilized by isolator 15, and is radiated from antenna 25 to the space through antenna duplexer 16.

On the other hand, in the receiver circuit, the spurious of the signal received with antenna 25 is removed with BPF 17 through antenna duplexer 16, and is input to first mixer 20 through amplifier 18 and BPF 19.

First mixer 20 mixes reception signal and the first local signal generated with voltage controlled oscillator 41, thereby, the first intermediate frequency signal is obtained. The first intermediate frequency signal is limited to the desired band through filter 21, and input to second mixer 22.

Second mixer 22 mixes a reception signal which passes filter 21 and the second local signal which is generated with voltage controlled oscillator (VCO) 42 based on the output signal of PLLIC 102, thereby, the second intermediate frequency signal is obtained.

The second intermediate frequency signal is limited to the desired band through filter 23 and is amplified to an enough level to be able to be demodulated with limiter 24, thereafter reception information is extracted with the detection circuit of the latter part not shown in the figure.

In the radio section of the cellular phone, which is constructed as mentioned above, block 26, which includes PLLIC 101 and PLLIC 102 as shown in FIG. 3, shown in dotted line is integrated.

When the present invention is applied to the cellular phone which is constructed in the as described above, will be explained. The frequency of the first local signal is the vicinity of 1 GHz as mentioned above and the frequency of the first intermediate frequency signal often used in the cellular phone is 130 MHz band.

Therefore, a case in which the oscillation frequency of voltage controlled oscillator 4 is assumed to be 1 GHz, the phase comparison frequency in phase comparator 2 is assumed to be 25 kHz, and dividing parameter K of prescaler 5 is assumed to be 32 ($=2^5$) will be explained.

Figure 4A:
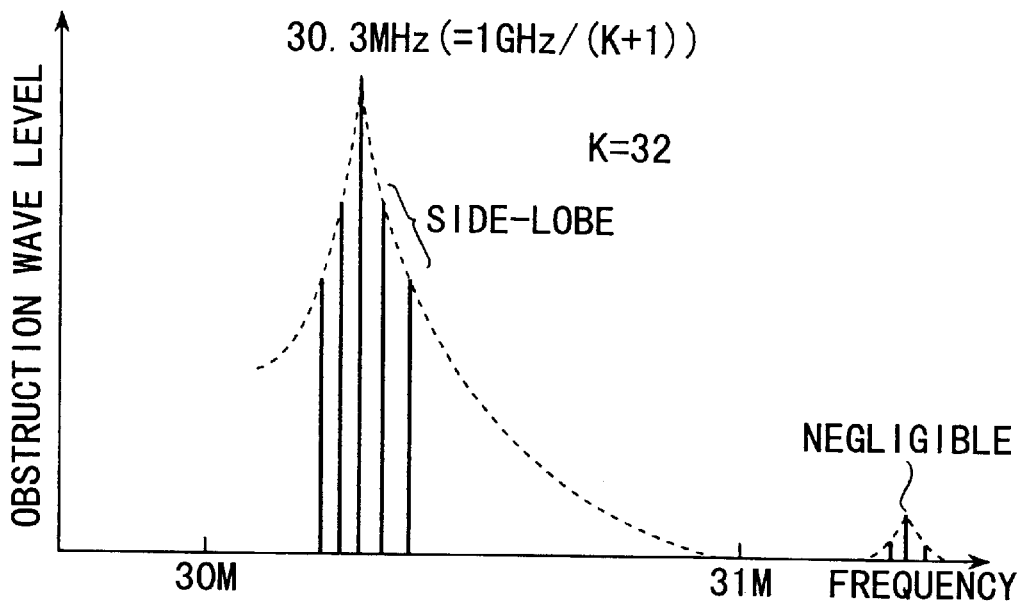
FIG. 4A and FIG. 4B are figures to explain the obstruction wave level by the output of dividing when the number of dividings of prescaler shown in FIG. 1 is changing controlled.

First, the signal at the "L" level is input from the controller not shown in the figure, for example, to polarity changer 27 as a change control signal, and, when the polarity inversion of the switch signal by polarity changer 27 is not preformed, the output of prescaler 5 becomes a product of the signal of 1 GHz/32=31.25 MHz by FSK (Frequency-Shift Keying) at 25 kHz cycle, because of A<<N. The signal with a big level appears at 31.25 MHz and the side-lobes on the both sides at intervals of 25 kHz are generated, in this spectrum as shown in FIG. 4A.

Figure 4B:
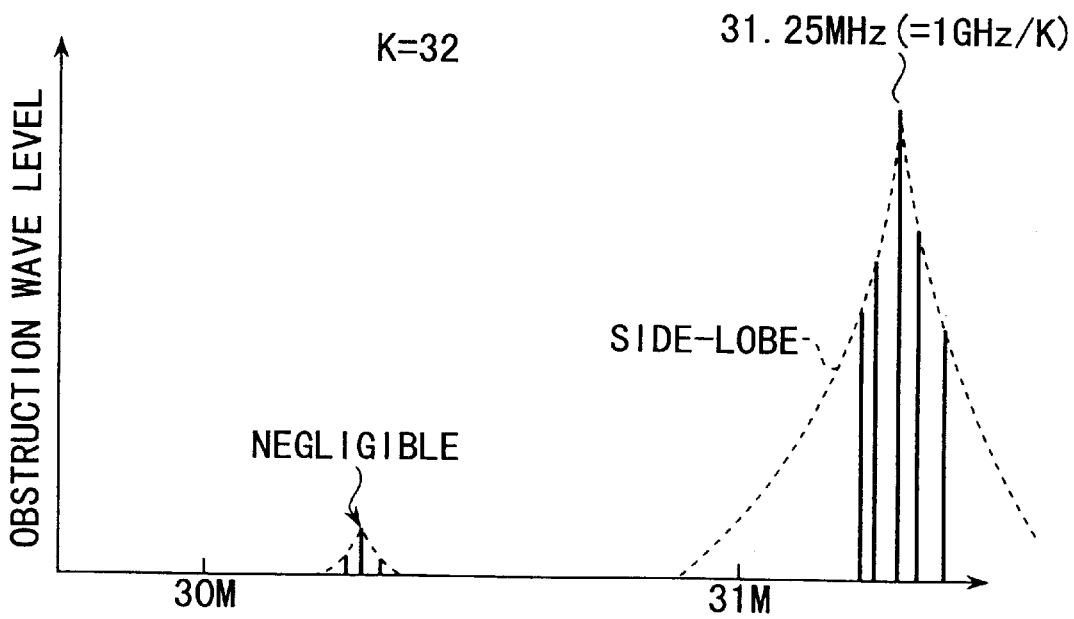

On the other hand, when the signal at the "H" level is input to polarity changer 27 as a change control signal and the polarity inversion of the switch signal by polarity changer 27 is performed, the output of prescaler 5 becomes a product of the signal of 1 GHz/33=30.3 MHz by FSK at 25 kHz cycle because of A<<N. The signal with a big level appears at 30.3 MHz and the side-lobes on the both sides at intervals of 25 kHz are generated, in this spectrum as shown in FIG. 4B.

As mentioned above, when a dividing result obtained by performing 32 dividing or 33 dividing of the output of the voltage controlled oscillator 4 with prescaler 5 is obtained, among side-lobes of this dividing result, the harmonic (especially, fourth harmonic) is coincides with the frequency of the intermediate frequency the first at a considerably high probability signal, when the corresponding frequency synthesizer is applied to the radio section as shown in FIG. 3.

However, since the generated spurious frequency can be obtained by the calculation, in the frequency synthesizer with the configuration shown in FIG. 1, by setting the number of dividings of prescaler 5 in an appropriate value by polarity changer 27, and simultaneously setting the number of dividings of variable frequencydivider 6 and variable frequencydivider 7, it can be prevented from coinciding the harmonic with the frequency of the first intermediate frequency signal. That is, in the present invention, the number of dividings is calculated according to the transmitting and receiving channel, the number of dividings is set to K or K+1 by polarity changer 27, and the harmonic is prevented from coinciding with the frequency of the first intermediate frequency signal. As a result, it can be avoided that the transmitting and receiving channel is influenced by the harmonic component of the prescaler output.

The numerical value of the above-mentioned embodiment is assumption of application to the cellular phone, but since the number of dividings of prescaler 5 can be set in an appropriate value according to the frequency through the change control signal, for what kind of mobile communication system, it can be set to prevent from coinciding the harmonic of the output of prescaler 5 with the frequencies of the first intermediate frequency signal. Therefore, the generality is high even when integrating by making to IC with the circuit of the receiver circuit of the radio set used.

The present invention is not limited to the above-mentioned embodiment. For example, in the above-mentioned embodiment, the inversion of the polarity of the switch signal which switches the number of dividings of prescaler 5 is controlled by polarity changer 27 which consists of EX-or gate, but it is not limited to this, and various polarity inversion circuits are thought.

Since the change control signal is a signal which comparatively changes at high-speed, it might be not suitable to insert the inversion circuit though it is constructed by one gate. In this case, a similar effect can be achieved even if the inversion circuit is not used, when the large number of dividings can be set to variable frequencydivider 7, and the same waveform as reverse of the polarity are produced, consequentially. In this case, a similar effect is achieved if the relation of A>>(N−A) is satisfied.

In addition, though the switch control signal to polarity changer 27 is considered that it is given from the controller by the calculation, for example, it may be given from the table form, or may be given by a fixed value according to the use channel.

Additionally, the present invention can be achieved by various transformations within the scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A frequency synthesizer comprising:

a voltage controlled oscillator configured to generate an oscillation signal of a frequency corresponding to a control voltage;

a divider configured to divide said oscillation signal and to generate a dividing signal;

a reference signal oscillator configured to generate a reference signal;

a phase comparator configured to obtain a phase error between the reference signal and the dividing signal; and a filter to smooth a comparison result of said phase comparator and generate the control voltage, wherein said divider comprises:

a prescaler configured to divide a frequency of the oscillation signal by one of a plurality of selectable values based on a switching signal, generating a frequency divided oscillation signal, wherein the prescaler outputs a first prescaler output signal while dividing and outputs a second prescaler output signal when dividing is complete;

a variable divider configured to receive and divide a frequency of the frequency divided oscillation signal from the prescaler by a value N, wherein the variable divider outputs a first variable divider output signal while dividing and outputs a second variable divider output signal when dividing is complete;

an AND gate having as a first input the frequency divided oscillation signal from the prescaler;

a swallow counter configured to receive and divide an output of the AND gate by a value A, wherein the swallow counter outputs a first swallow counter output signal while dividing and outputs a second swallow counter output signal when dividing is complete;

an inverter configured to receive the output signal of the swallow counter, wherein the AND gate has as a second input and output of the inverter; and a selector configured to output the switching signal to the prescaler based on the output signal of the swallow counter and a control signal, wherein the selector operates as a buffer or an inverter based on the control signal.

2. The frequency synthesizer according to claim 1, wherein said control signal is obtained by a predetermined arithmetic.

3. The frequency synthesizer according to claim 2, wherein the plurality of selectable values include $2^n$ and $2^{n+1}$, wherein n is a natural number.

4. The frequency synthesizer according to claim 1, wherein the plurality of selectable values include $2^n$ and $2^{n+1}$, wherein n is a natural number.

5. The frequency synthesizer according to claim 1, wherein said prescaler divides a frequency of the oscillation signal by one of a plurality of selectable values based on a signal level of the switching signal from the selector, and said selector sets the signal level of the switching signal based on a signal level of the output of the swallow counter and the control signal.

6. The frequency synthesizer according to claim 5, wherein said control signal is obtained by a predetermined arithmetic.

7. The frequency synthesizer according to claim 6, wherein the plurality of selectable values include $2^n$ and $2^{n+1}$, wherein n is a natural number.

8. The frequency synthesizer according to claim 5, wherein the plurality of selectable values include $2^n$ and $2^{n+1}$, wherein n is a natural number.

9. The frequency synthesizer according to claim 1, said control signal is input by a user's operation.

10. The frequency synthesizer according to claim 1, wherein said control signal is fixed to one of "H" and "L" levels.

11. The frequency synthesizer according to claim 1, wherein said selector is an Exclusive-OR circuit.

12. A cellular phone comprising:

a transmitter/receiver circuit which transmits/receives a signal; and a frequency synthesizer, wherein said frequency synthesizer comprises:

a prescaler configured to divide a frequency of the oscillation signal by one of a plurality of selectable values based on a switching signal, generating a frequency divided oscillation signal, wherein the prescaler outputs a first prescaler output signal while dividing and outputs a second prescaler output signal when dividing is complete;

a variable divider configured to receive and divide a frequency of the frequency divided oscillation signal from the prescaler by a value N, wherein the variable divider outputs a first variable divider output signal while dividing and outputs a second variable divider output signal when dividing is complete;

an AND gate having as a first input the frequency divided oscillation signal from the prescaler;

a swallow counter configured to receive and divide an output of the AND gate by a value A, wherein the swallow counter outputs a first swallow counter output signal while dividing and outputs a second swallow counter output signal when dividing is complete;

an inverter configured to receive the output signal of the swallow counter, wherein the AND gate has as a second input an output of the inverter; and a selector configured to output the switching signal to the prescaler based on the output signal of the swallow counter and a control signal, wherein the selector operates as a buffer or an inverter based on the control signal.

13. The cellular phone according to claim 12, said control signal is obtained by a predetermined arithmetic.

14. The cellular phone according to claim 13, wherein the plurality of selectable values include $2^n$ and $2^{n+1}$, wherein n is a natural number.

15. The cellular phone according to claim 12, wherein the plurality of selectable values include $2^n$ and $2^{n+1}$, wherein n is a natural number.

16. The cellular phone according to claim 12, wherein said prescaler divides a frequency of the oscillation signal by one of a plurality of selectable values based on a signal level of the switching signal from the selector, and said selector sets the signal level of the switching signal based on a signal level of the output of the swallow counter and the control signal.

17. The cellular phone according to claim 16, wherein said control signal is obtained by a predetermined arithmetic.

18. The cellular phone according to claim 17, wherein the plurality of selectable values include $2^n$ and $2^{n+1}$, wherein n is a natural number.

19. The cellular phone according to claim 16, wherein the plurality of selectable values include $2^n$ and $2^{n+1}$, wherein n is a natural number.

20. The frequency synthesizer according to claim 12, said control signal is input by a user's operation.

21. The frequency synthesizer according to claim 12, wherein said control signal is fixed to one of "H" and "L" levels.

22. The frequency synthesizer according to claim 12, wherein said selector is an Exclusive-OR circuit.

* * * * *